US009934957B2

(12) United States Patent
Kozai et al.

(10) Patent No.: US 9,934,957 B2
(45) Date of Patent: Apr. 3, 2018

(54) METHOD OF PROCESSING BONDED WAFER

(71) Applicant: DISCO CORPORATION, Tokyo (JP)

(72) Inventors: Hirohiko Kozai, Tokyo (JP); Kazuki Terada, Tokyo (JP); Meiyu Piao, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/474,766

(22) Filed: Mar. 30, 2017

(65) Prior Publication Data

US 2017/0294300 A1    Oct. 12, 2017

(30) Foreign Application Priority Data

Apr. 7, 2016  (JP) .................................. 2016-077308

(51) Int. Cl.
| | |
|---|---|
| H01L 21/02 | (2006.01) |
| H01L 21/66 | (2006.01) |
| H01L 21/68 | (2006.01) |
| H01L 21/687 | (2006.01) |
| G06T 7/00 | (2017.01) |

(52) U.S. Cl.
CPC ...... *H01L 21/02021* (2013.01); *G06T 7/0004* (2013.01); *H01L 21/681* (2013.01); *H01L 21/68764* (2013.01); *H01L 22/20* (2013.01); *G06T 2207/30148* (2013.01)

(58) Field of Classification Search
CPC ............. H01L 21/02021; H01L 21/681; H01L 21/687; H01L 21/68764
See application file for complete search history.

(56) References Cited

U.S. PATENT DOCUMENTS

2009/0153868 A1 *  6/2009  Sawabe ................ B23K 26/032
                                                         356/445

FOREIGN PATENT DOCUMENTS

| JP | 4-263425 | 9/1992 |
|---|---|---|
| JP | 2003-273053 | 9/2003 |
| JP | 2004-207459 | 7/2004 |
| JP | 2011-249572 | 12/2011 |

* cited by examiner

*Primary Examiner* — Phat X Cao
(74) *Attorney, Agent, or Firm* — Greer Burns & Crain, Ltd.

(57) ABSTRACT

A wafer is bonded to a support plate by cutting off, with a cutting blade, an annular portion of the bonded wafer which extends from the outer peripheral edge of the bonded wafer to a position that is spaced radially inwardly toward the center of the bonded wafer by a predetermined distance. Bonding is done by a method that includes a captured image forming step of irradiating the outer peripheral edge of the bonded wafer with light emitted from an irradiating unit and passing through a through hole, and imaging the outer peripheral edge of the bonded wafer with an imaging camera disposed in facing relation to the irradiating unit with the bonded wafer interposed therebetween, thereby to capture an image, and an outer peripheral edge position detecting step of detecting an outer peripheral edge position of the bonded wafer on the basis of the captured image.

1 Claim, 6 Drawing Sheets

METHOD OF PROCESSING BONDED WAFER

BACKGROUND OF THE INVENTION

Field of the Invention

The present invention relates to a method of processing a bonded wafer in which a wafer is bonded to a support plate by cutting off, with a cutting blade, an annular portion of the bonded wafer which extends from the outer peripheral edge of the bonded wafer to a position that is spaced radially inwardly toward the center of the bonded wafer by a predetermined distance.

Description of the Related Art

Semiconductor wafers are processed to have devices such as integrated circuits (ICs), large-scale integration (LSI) circuits, etc. formed on their face sides and demarcated by projected dicing lines called streets arranged in a grid pattern. The semiconductor wafers are then ground on their reverse sides to a predetermined thickness, and thereafter diced along the streets into individual chips by a dicing apparatus. The divided chips are widely used in various types of electronic devices including mobile phones, personal computers, etc. In recent years, chips for use in electronic devices have been required to be reduced in size and thickness in order to meet growing demands for increasingly smaller and thinner electronic devices. In some applications, semiconductor wafers (hereinafter also referred to simply as "wafers") with a plurality of devices formed thereon may be ground to a thin configuration having a thickness of up to 100 μm.

Generally, a wafer has an outer peripheral edge beveled to an arcuate cross-sectional shape in order to prevent itself from being chipped or emitting dust during its own fabrication process. When such a wafer is ground thin in the manner described above, the beveled portion becomes sharp like a knife edge, tending to allow the outer peripheral edge of the wafer to be chipped, causing damage to the wafer. Accordingly, it has been the general practice to perform an edge trimming process on a wafer before the wafer is ground thin, removing the beveled portion from the wafer along the outer peripheral edge thereof (see, for example, Japanese Patent Laid-Open No. 2003-273053 and Japanese Patent Laid-Open No. 2004-207459).

When the edge trimming process is to be performed on a wafer, it is important to accurately spot the position of the outer peripheral edge of the wafer prior to the edge trimming process. Specifically, the outer peripheral edge and its vicinity of the wafer is imaged from above to capture its image by imaging means (imaging camera), and the position of the outer peripheral edge (hereinafter also referred to as "outer peripheral edge position") is detected from the captured image. If the outer peripheral edge position of the wafer is detected at three or more locations, then the central position and radius, etc. of the wafer can be determined (see, for example, Japanese Patent Laid-Open No. 2011-249572). The edge trimming process is carried out after the position of the cutting blade has been determined on the basis of the information thus obtained.

In order to improve the handleability of thin wafers or to prevent wafers from being warped and fractured while they are being processed, it has been known to bond a wafer to a support plate thereby to produce a bonded wafer and to handle and process the bonded wafer as a single entity (see, for example, Japanese Patent Laid-Open No. 1992-263425). The bonded wafer includes a wafer, a support plate having essentially the same diameter as the wafer, and an adhesive member bonding the wafer and the support plate to each other. For performing an edge trimming process on such a bonded wafer, the outer peripheral edge and its vicinity of the bonded wafer is imaged from above to capture its image by imaging means (imaging camera), and the outer peripheral edge position of the bonded wafer is detected from the captured image.

SUMMARY OF THE INVENTION

However, the bonded wafers suffer a problem in that it may be difficult to accurately detect the outer peripheral edge position of a bonded wafer from its captured image, depending on the types, thicknesses, and sizes of the components that make up the bonded wafer and also the positional relationship between those components. Specifically, the above problem manifests itself in situations where the wafer is bonded to the support plate at a position slightly displaced toward the center of the support plate, the diameter of the wafer is smaller than the diameter of the support plate, and the adhesive member sticks out on the outer peripheral edges of the wafer and the support plate.

In any of the above undesirable situations, the image captured by imaging the wafer from above includes the outer peripheral edge of the wafer, the outer peripheral edge of the support plate, and the adhesive member. It is not easy to determine from the captured image which of the edges (boundary lines) depicted in the image represent the outer peripheral edge of the bonded wafer, and an error may possibly occur when the outer peripheral edge of the bonded wafer is detected. According to the above process of the related art, therefore, it is difficult to accurately detect the outer peripheral edge position of the bonded wafer, and the cutting blade cannot be positioned to a nicety for the edge trimming process to be performed on the bonded wafer.

It is an object of the present invention to provide a processing method for bonded wafers which accurately detects the outer peripheral edge position of a bonded wafer to position a cutting blade highly accurately at a desired position with respect to the bonded wafer.

In accordance with an aspect of the present invention, there is provided a method of processing a bonded wafer in which a wafer is bonded to a support plate by cutting off, with a cutting blade, an annular portion of the bonded wafer which extends from the outer peripheral edge of the bonded wafer to a position that is spaced radially inwardly toward the center of the bonded wafer by a predetermined distance, including a holding step of holding the support plate of the bonded wafer on a holding unit, the holding unit including a chuck table having a holding surface for holding the bonded wafer, and irradiating means for irradiating an outer peripheral edge of the bonded wafer with light through a through hole defined in the chuck table and extending vertically therethrough, a captured image forming step of, after performing the holding step, irradiating the outer peripheral edge of the bonded wafer with light emitted from the irradiating means and passing through the through hole, and imaging the outer peripheral edge of the bonded wafer with imaging means disposed in facing relation to the irradiating means with the bonded wafer interposed therebetween, thereby to capture an image, an outer peripheral edge position detecting step of, after performing the captured image forming step, detecting an outer peripheral edge position of the bonded wafer on the basis of the captured image, and a processing step of, after performing the outer peripheral edge position detecting step, causing a cutting blade which is rotating around its own axis to cut into the bonded wafer at a position that is spaced a predetermined distance from the outer peripheral edge of the bonded wafer toward the center of the bonded wafer, on the basis of the detected outer peripheral edge position of the bonded wafer, and rotating the chuck table around its own axis to enable the cutting blade to cut off an annular portion from an outer peripheral region of the bonded wafer.

According to the above method, the irradiating means irradiates the outer peripheral edge of the bonded wafer, and the imaging means disposed in facing relation to the irradiating means with the bonded wafer interposed therebetween images the outer peripheral edge and its vicinity of the bonded wafer thereby to capture an image. The captured image includes a portion of the bonded wafer which appears as a shadow in the image. Since the boundary between captured light and the shadow in the captured image is determined as the outer peripheral edge of the bonded wafer, the outer peripheral edge portion of the bonded wafer can accurately be detected regardless of the structure of the bonded wafer, and the cutting blade can be positioned to a nicety in a desired position for processing the bonded wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
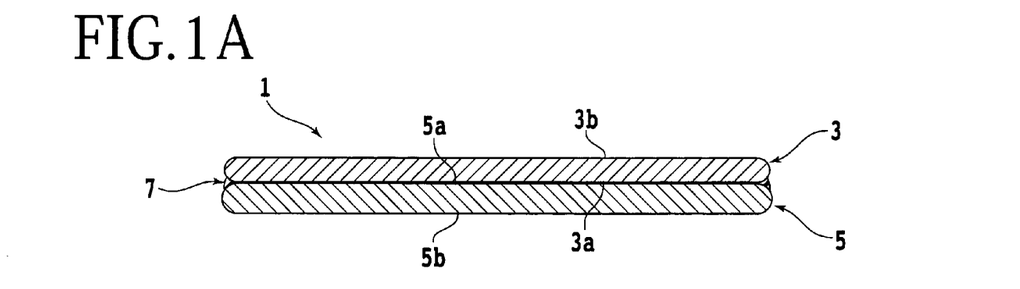
FIG. 1A is a cross-sectional view depicting the cross-sectional structure of a bonded wafer.
Figure 1B:
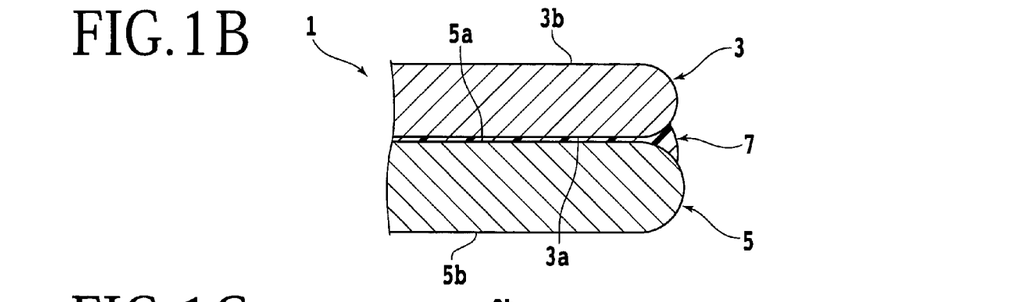
FIG. 1B is an enlarged fragmentary cross-sectional view depicting the cross-sectional structure of an outer peripheral edge and its vicinity of the bonded wafer.

A processing method according to a preferred embodiment of the present invention will be described below with reference to the accompanying drawings. FIG. 1A depicts in cross section the cross-sectional structure of a bonded wafer, which serves as a workpiece to be processed by the processing method according to the present embodiment. FIG. 1B depicts in enlarged fragmentary cross section the cross-sectional structure of an outer peripheral edge and its vicinity of the bonded wafer depicted in FIG. 1A.

As depicted in FIGS. 1A and 1B, a bonded wafer 1 has a wafer 3 and a support plate 5 which are integrally bonded to each other by an adhesive member 7 interposed between a face side 3a of the wafer 3 and a first surface 5a of the support plate 5. The wafer 3 can be handled together with the support plate 5 as a single entity in the form of the bonded wafer 1, so that the handleability of wafers that have been made increasingly thinner in recent years is improved, and wafers are effectively prevented from being warped and fractured while they are being processed. The face side 3a of the wafer 3 on which devices have been formed faces the first surface 5a of the support plate 5. The wafer 3 has a reverse side 3b which, when the bonded wafer 1 is held on a chuck table, faces upwardly as an upper surface. The support plate 5 has a second surface 5b which, when the bonded wafer 1 is held on the chuck table, faces downwardly as a lower surface (held surface). The bonded wafer 1 is securely held on the chuck table when the second surface 5b is attracted under suction to the chuck table.

The wafer 3 is made of silicon, sapphire, SiC (silicon carbide), or any of other compound semiconductors or the like, with devices such as ICs, LSI circuits, micro-electromechanical systems (MEMS), etc. formed on its face side. The support plate 5 may include, for example, a wafer made of the same material as the material of the wafer 3.

Figure 2:
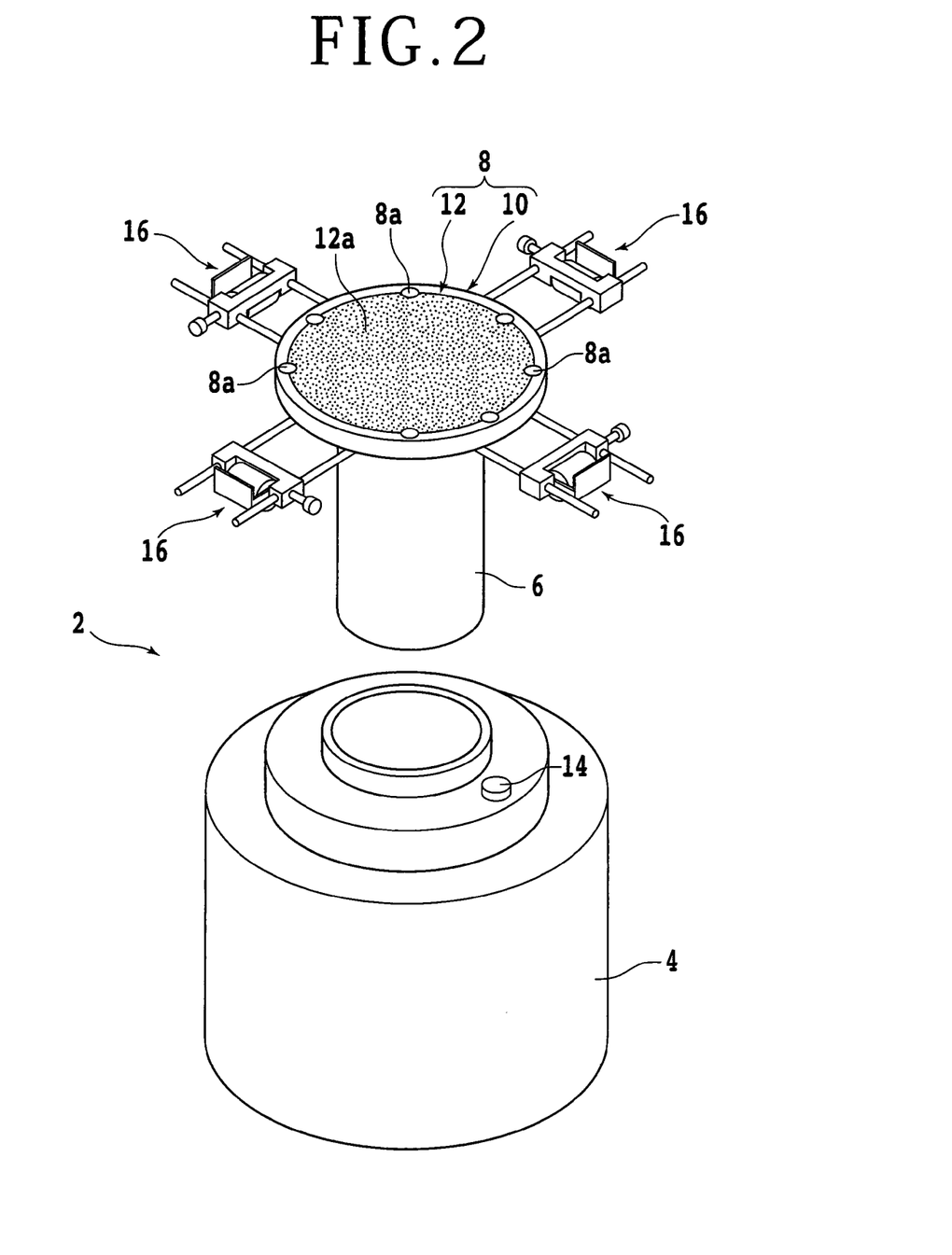
FIG. 2 is an exploded perspective view depicting the structure of a holding unit by way of example.

A holding unit to be used in carrying out the processing method according to the present embodiment will be described below with reference to FIG. 2. FIG. 2 depicts in exploded perspective the structure of the holding unit by way of example. For illustrative purposes, a support housing 4 and a rotational shaft 6 of the holding unit are depicted as being separate from each other.

The holding unit, generally denoted by 2 in FIG. 2, includes the support housing 4, the rotational shaft 6 rotatably supported in the support housing 4, and a chuck table 8 coupled to an upper end of the rotational shaft 6. The chuck table 8 holds the bonded wafer 1 thereon. When the rotational shaft 6 is rotated around its own axis, the chuck table 8 rotates around its own axis, and hence the bonded wafer 1 held on the chuck table 8 also rotates in unison therewith.

The chuck table 8 includes a disk-shaped member 10 made of metal such as stainless steel or the like and having a recess defined centrally in its upper surface, and a porous member 12 made of porous ceramics or the like disposed in the recess of the disk-shaped member 10. The porous member 12 has an upper holding surface 12a for holding the bonded wafer 1 thereon, and is connected to a suction source (not depicted) by way of fluid communication therewith. The porous member 12 has a plurality of minute suction holes in the upper holding surface 12a. When a negative pressure generated by the suction source acts through the minute suction holes, the porous member 12 holds the bonded wafer 1 placed on the upper holding surface 12a under suction. The chuck table 8 also has a plurality of through holes 8a defined in an outer peripheral portion thereof and extending vertically therethrough. Members made of glass or the like which transmit light therethrough are embedded in the respective through holes 8a. Irradiating means 14 such as a light emitting diode (LED) or the like for emitting light is mounted on an upper surface of the support housing 4. The light emitted from the irradiating means 14 passes through the through holes 8*a* one at a time. A plurality of clamps 16 are attached to a lower surface of the chuck table 8 by suitable fixing means.

The processing method according to the present embodiment will be described below. In the processing method according to the present embodiment, a holding step is initially carried out. In the holding step, the bonded wafer 1 is held on the chuck table 8 of the holding unit 2. The holding step is followed by a captured image forming step. In the captured image forming step, light emitted from the irradiating means and passing across the outer peripheral edge of the bonded wafer 1 is captured to form a captured image. After the captured image forming step, an outer peripheral edge position detecting step is carried out. In the outer peripheral edge position detecting step, an image processing process such as a binarizing process or the like is performed on the captured image to detect an outer peripheral edge position of the bonded wafer 1. The outer peripheral edge position detecting step is followed by a processing step. In the processing step, a cutting blade is positioned at a desired position on the basis of the information about the obtained outer peripheral edge position of the bonded wafer 1, and then actuated to cut the bonded wafer 1. These steps of the processing method will be described below.

Figure 3:
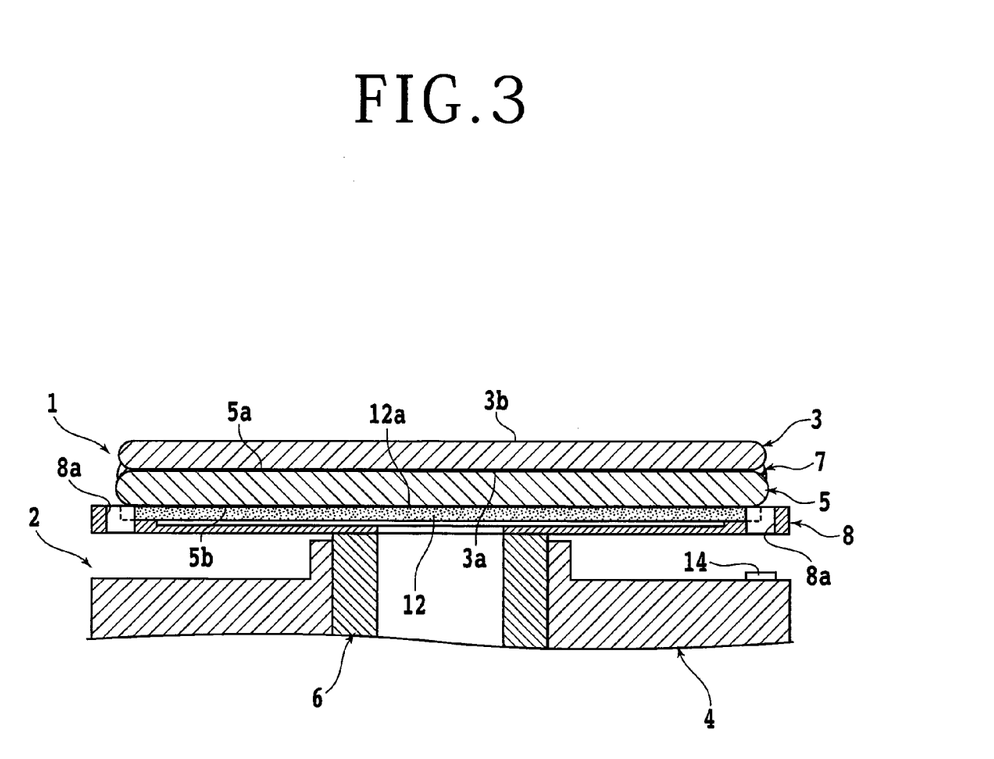
FIG. 3 is a cross-sectional view of a bonded wafer and a chuck table in a holding step.

First, the holding step of the processing method according to the present embodiment will be described below with reference to FIG. 3. FIG. 3 depicts in cross section the bonded wafer 1 and the holding unit 2 in the holding step. In the holding step, the bonded wafer 1 is placed on the upper holding surface 12*a* of the chuck table 8. Then, a negative pressure generated by the suction source acts through the suction holes in the porous member 12 to hold the bonded wafer 1 on the chuck table 8. While the processing method according to the present embodiment is being carried out, the bonded wafer 1 is continuously held on the chuck table 8.

Figure 4:
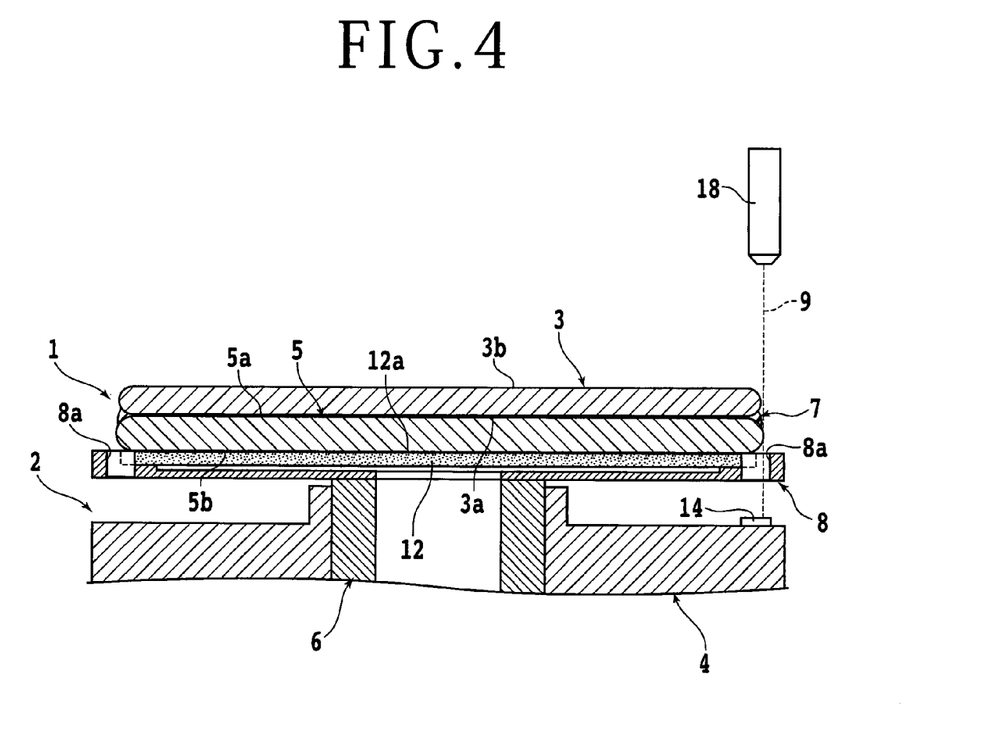
FIG. 4 is a cross-sectional view depicting the positional relationship between the bonded wafer, the holding unit, and imaging means (imaging camera) in a captured image forming step.
Figure 5A:
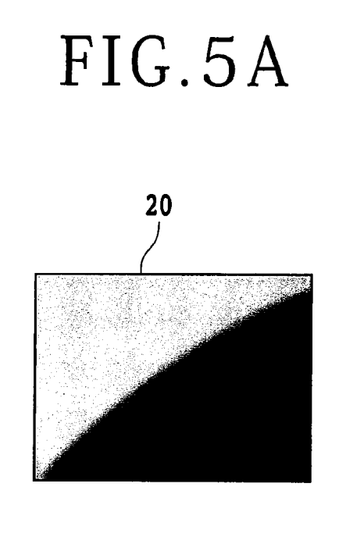
FIG. 5A is a schematic diagram depicting by way of example a captured image that is formed in the captured image forming step.

The captured image forming step of the processing method according to the present embodiment will be described below with reference to FIG. 4. FIG. 4 depicts in cross section the positional relationship between the bonded wafer 1, the holding unit 2, and imaging means (imaging camera) 18 in the captured image forming step. The imaging means (imaging camera) 18 is disposed in facing relation to the irradiating means 14 with the bonded wafer 1 interposed therebetween. In the captured image forming step, the irradiating means 14 emits light 9. The light 9 passes through the through holes 8*a*, one at a time, in the chuck table 8, and irradiates the outer peripheral edge and its vicinity of the bonded wafer 1. At this time, the light 9 is partly blocked by the bonded wafer 1 and partly passes across the outer peripheral edge of the bonded wafer 1 and reaches the imaging means (imaging camera) 18. The imaging means (imaging camera) 18 then captures the light 9, and produces a captured image 20 (see FIG. 5A) in which the portion of the bonded wafer 1 that has blocked part of the light 9 appears as a shadow. The boundary between the captured light and the shadow in the captured image 20 represents the outer peripheral edge of the bonded wafer 1.

Figure 1C:
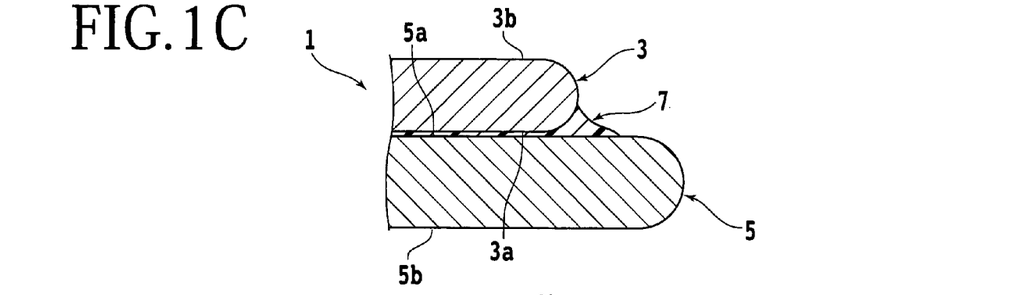
FIG. 1C is an enlarged fragmentary cross-sectional view depicting the cross-sectional structure of an outer peripheral edge and its vicinity of a bonded wafer.
Figure 1D:
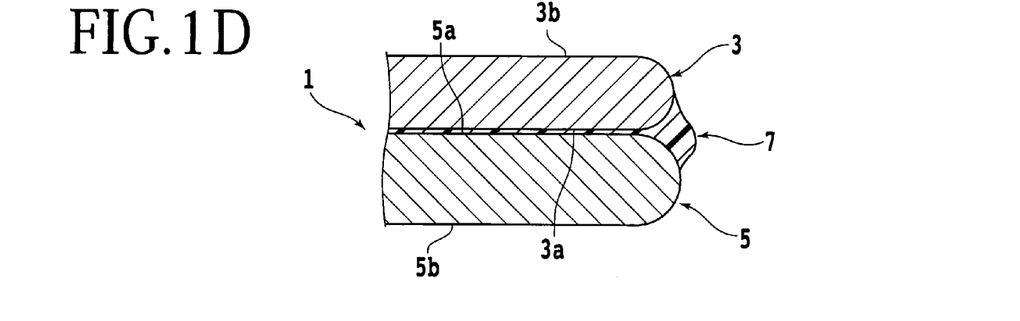
FIG. 1D is an enlarged fragmentary cross-sectional view depicting the cross-sectional structure of an outer peripheral edge and its vicinity of a bonded wafer.

If the outer peripheral edge position of the bonded wafer 1 is to be detected from the captured image independently of the processing method according to the present embodiment, it is not necessarily easy to properly determine the outer peripheral edge of the bonded wafer 1. For example, when the outer peripheral edge and its vicinity of the bonded wafer 1 are imaged simply from above, the wafer 3 appears in the captured image. If the wafer 3 is bonded to the support plate 5 at a position slightly displaced toward the center of the support plate 5, or if the diameter of the wafer 3 is smaller than the diameter of the support plate 5 (see FIG. 1C), then the support plate 5 beneath the wafer 3 appears in the captured image. Furthermore, if the adhesive member 7 provided between the wafer 3 and the support plate 5 sticks out from the outer peripheral edge of the wafer 3 (see FIGS. 1C and 1D), the adhesive member 7 also appears in the captured image. Therefore, when the outer peripheral edge and its vicinity of the bonded wafer 1 is imaged simply from above independently of the processing method according to the present embodiment, the outer peripheral edge of the wafer 3, the outer peripheral edge of the support plate 5, and the adhesive member 7 appear as edges (boundary lines) in the captured image. Inasmuch as the outer peripheral edge of the bonded wafer 1 cannot easily and accurately be determined from among the edges (boundary lines) appearing in the captured image, an error may possibly occur when the outer peripheral edge position of the bonded wafer 1 is detected.

On the other hand, the captured image produced by the processing method according to the present embodiment includes only the edge (boundary line) representing the outer peripheral edge of the bonded wafer 1. Therefore, the outer peripheral edge of the bonded wafer 1 can easily be spotted directly and uniquely from the captured image. As a result, the possibility of an error in determining the outer peripheral edge position of the bonded wafer 1 from the captured image is greatly reduced.

In the processing method according to the present embodiment, furthermore, the outer peripheral edge and its vicinity of the bonded wafer 1 is imaged using light whose intensity is higher than that in the case where it is imaged without the irradiating means. The characteristics of the light 9 that is applied to irradiate the outer peripheral edge and its vicinity of the bonded wafer 1 may be adjusted into characteristics that are optimum to capture a desired image. Therefore, it is possible to obtain a high-contrast captured image. The outer peripheral edge position of the bonded wafer 1 can thus be detected highly accurately. Moreover, the outer peripheral edge positions of bonded wafers can be detected stably with a minimum of variations as they are imaged in a constant imaging environment without being adversely affected by ambient light.

In the processing method according to the present embodiment, in addition, the outer peripheral edge and its vicinity of the bonded wafer 1 is positionally changed and imaged at a total of three or more different locations. The outer peripheral edge position of the bonded wafer 1 is detected on the outer peripheral edge at the three or more different locations, so that it is possible to determine a circumscribed circle passing through the three or more different locations on the outer peripheral edge. Accordingly, the coordinates of the central position of the bonded wafer 1 and the radius of the bonded wafer 1 can be determined. The outer peripheral edge and its vicinity of the bonded wafer 1 is imaged at different locations as follows: The rotational shaft 6 of the holding unit 2 depicted in FIG. 2 is rotated to move one of the through holes 8*a* which has not yet been used for imaging to the position between the irradiating means 14 and the imaging means (imaging camera) 18. As the bonded wafer 1 is also rotated when the rotational shaft 6 is rotated, an area of the outer peripheral edge which has not yet been imaged is placed between the irradiating means 14 and the imaging means (imaging camera) 18. In this manner, the outer peripheral edge and its vicinity of the bonded wafer 1 is positionally changed and imaged at three or more different locations.

Figure 5B:
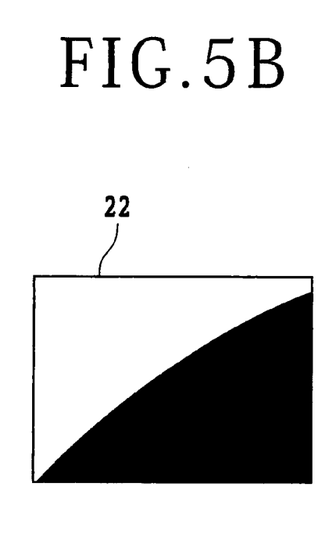
FIG. 5B is a schematic diagram depicting a binarized image that is generated by performing a binarizing process on the captured image.
Figure 5C:
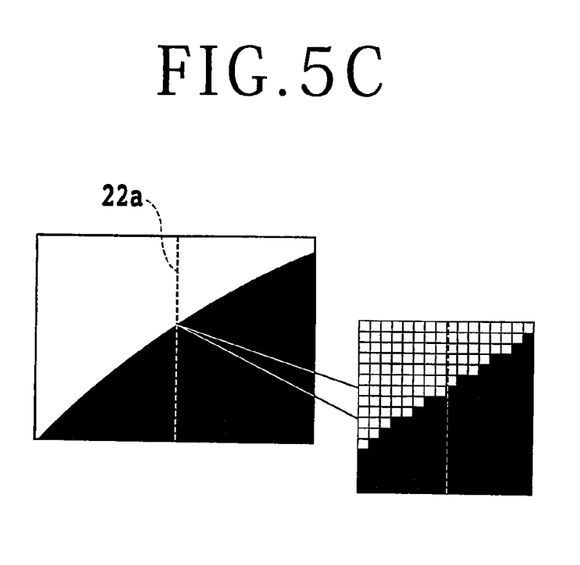
FIG. 5C is a schematic diagram depicting the manner in which an outer peripheral edge position is detected from the captured image.

The outer peripheral edge position detecting step of the processing method according to the present embodiment will be described below with reference to FIGS. 5B and 5C. First, in order to reliably detect the outer peripheral edge position of the bonded wafer 1, an image processing process such as a binarizing process or the like, for example, is performed on the captured image 20 (see FIG. 5A) obtained in the captured image forming step. FIG. 5B schematically depicts a binarized image 22 that is generated by performing a binarizing process on the captured image 20 depicted in FIG. 5A. The binarized image 22 clearly indicates the boundary between the captured light and the shadow in the captured image. The binarizing process is a process for converting a grayscale image into an image of two gradations of black and white. According to the binarizing process, a threshold value is determined in advance, and if the luminance value of each pixel is higher than the threshold value, then it is converted to white, and if it is lower than the threshold value, then it is converted to black. Providing a choice is available of different values for the threshold value, the threshold value may be adjusted to optimize the binarizing process.

Then, the outer peripheral edge position of the bonded wafer 1 is detected on the basis of the binarized image 22 thus obtained. One example of a process of detecting the outer peripheral edge position of the bonded wafer 1 will be described below with reference to FIG. 5C. First, a straight line 22a is established in the binarized image 22. Then, the luminance values of the pixels on the straight line 22a are determined successively from one end to the other of the straight line 22a. Since the position where the luminance value changes from white to black or from black to white is the position of the outer peripheral edge, this position is detected as the outer peripheral edge position of the bonded wafer 1 and its coordinates are recorded. If captured images have been obtained at a total of three or more locations on the outer peripheral edge of the bonded wafer 1, then an image processing process such as a binarizing process or the like is performed on each of the obtained captured images, and the outer peripheral edge position of the bonded wafer 1 is detected from each of the processed images. In this fashion, the coordinates of the central position of the bonded wafer 1 and the radius of the bonded wafer 1 are determined. These items of information will be made useful in determining a position where a cutting blade is to cut into the bonded wafer 1 in a subsequent step.

In the above processing method according to the present embodiment, the outer peripheral edge and its vicinity of the bonded wafer 1 is imaged at a total of three or more different locations, and then the outer peripheral edge position of the bonded wafer 1 is detected from each of the captured images. However, after the outer peripheral edge and its vicinity of the bonded wafer 1 is imaged at a first location, the outer peripheral edge position of the bonded wafer 1 may be detected from the captured image, and after the outer peripheral edge and its vicinity of the bonded wafer 1 is imaged at a second location, the outer peripheral edge position of the bonded wafer 1 may be detected from the captured image. Then, after the outer peripheral edge and its vicinity of the bonded wafer 1 are imaged at a third location, the outer peripheral edge position of the bonded wafer 1 may be detected from the captured image.

Figure 6A:
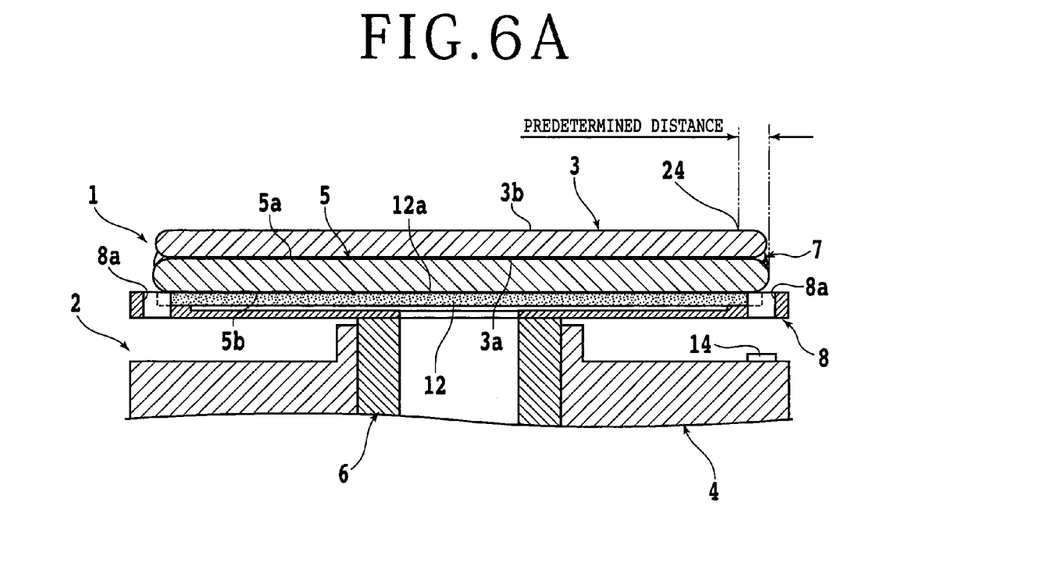
FIG. 6A is a cross-sectional view illustrative of a projected cutting position.
Figure 6B:
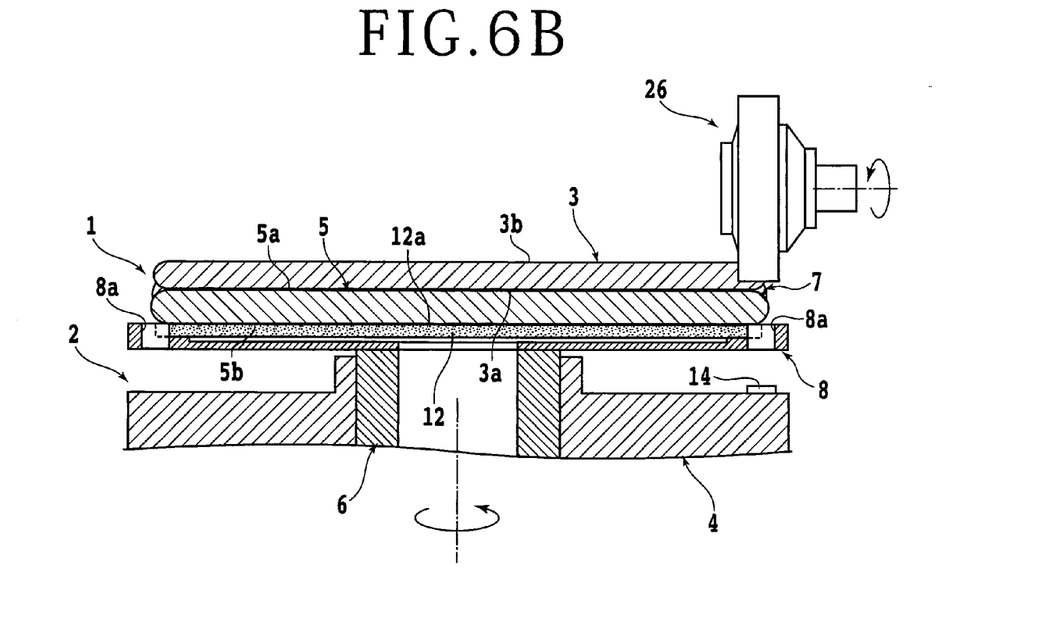
FIG. 6B is a cross-sectional view illustrative of the positional relationship between the bonded wafer, the chuck table, and a cutting blade in a processing step.

The processing step of the processing method according to the present embodiment will be described below with reference to FIGS. 6A and 6B. First, a position on the bonded wafer 1 that is spaced a predetermined distance from the outer peripheral edge position thereof detected in the outer peripheral edge position detecting step toward the center of the bonded wafer 1 is assumed to be a projected cutting position 24 as depicted in FIG. 6A. The projected cutting position 24 is a position where a cutting blade is to cut into the bonded wafer 1, determined in view of the thickness of the cutting blade, etc. Then, a cutting blade 26 (see FIG. 6B) which is rotating around its own axis is displaced downwardly to cut into the outer peripheral edge of the wafer 3 across a width extending to the projected cutting position 24. FIG. 6B illustrates in cross section the manner in which the rotating cutting blade 26 cuts into the wafer 3. While the cutting blade 26 is continuously rotating around its own axis, the chuck table 8 is rotated around its own axis to enable the cutting blade 26 to cut off an annular portion from the outer peripheral region of the bonded wafer 1 across the width referred to above.

In the steps described above, the outer peripheral edge position of a bonded wafer can accurately be detected regardless of the structure of the bonded wafer, and the cutting blade can be positioned to a nicety in a desired position for cutting off an annular portion highly accurately from the outer peripheral region of the bonded wafer across a predetermined width thereof. The present invention is not limited to the specific details of the embodiment described above, but many changes and modifications may be made therein. For example, in the above embodiment, the irradiating means is mounted on the support housing, and the imaging camera is disposed in facing relation to the irradiating means with the bonded wafer interposed therebetween. However, the positional relationship between the irradiating means and the imaging camera may be reversed. Specifically, the imaging camera may be mounted on the support housing, and the irradiating means may be disposed in facing relation to the imaging camera with the bonded wafer interposed therebetween.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a bonded wafer in which a wafer is bonded to a support plate by cutting off, with a cutting blade, an annular portion of the bonded wafer which extends from the outer peripheral edge of the bonded wafer to a position that is spaced radially inwardly toward the center of the bonded wafer by a predetermined distance, comprising:

a holding step of holding the support plate of the bonded wafer on a holding unit, the holding unit including a chuck table having a holding surface for holding the bonded wafer, and irradiating means for irradiating an outer peripheral edge of the bonded wafer with light through a through hole defined in the chuck table and extending vertically therethrough;

a captured image forming step of, after performing the holding step, irradiating the outer peripheral edge of the bonded wafer with light emitted from the irradiating means and passing through the through hole, and imaging the outer peripheral edge of the bonded wafer with imaging means disposed in facing relation to the irradiating means with the bonded wafer interposed therebetween, thereby to capture an image;

an outer peripheral edge position detecting step of, after performing the captured image forming step, detecting an outer peripheral edge position of the bonded wafer on the basis of the captured image; and a processing step of, after performing the outer peripheral edge position detecting step, causing a cutting blade which is rotating around its own axis to cut into the bonded wafer at a position that is spaced a predetermined distance from the outer peripheral edge of the bonded wafer toward the center of the bonded wafer, on the basis of the detected outer peripheral edge position of the bonded wafer, and rotating the chuck table around its own axis to enable the cutting blade to cut off an annular portion from an outer peripheral region of the bonded wafer.

* * * * *